(12) United States Patent
Iwasaki

(10) Patent No.: US 9,691,591 B2
(45) Date of Patent: Jun. 27, 2017

(54) PLASMA PROCESSING APPARATUS

(75) Inventor: Masahide Iwasaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 641 days.

(21) Appl. No.: 14/127,286

(22) PCT Filed: Jun. 29, 2012

(86) PCT No.: PCT/JP2012/004230
§ 371 (c)(1),
(2), (4) Date: Dec. 18, 2013

(87) PCT Pub. No.: WO2013/001833
PCT Pub. Date: Jan. 3, 2013

(65) Prior Publication Data
US 2014/0174660 A1    Jun. 26, 2014

(30) Foreign Application Priority Data

Jun. 30, 2011  (JP) .................................. 2011-145476

(51) Int. Cl.
C23C 16/00    (2006.01)
C23F 1/00     (2006.01)
H01L 21/306   (2006.01)
H01J 37/32    (2006.01)

(52) U.S. Cl.
CPC .... *H01J 37/32201* (2013.01); *H01J 37/3222* (2013.01); *H01J 37/32211* (2013.01)

(58) Field of Classification Search
USPC .............................. 156/345.41; 118/723 MW
See application file for complete search history.

(56) References Cited

U.S. PATENT DOCUMENTS 5,063,329 A * 11/1991 Okamoto ................. H05H 1/46
                                                         313/231.31
5,311,103 A    5/1994 Asmussen et al.
(Continued)

FOREIGN PATENT DOCUMENTS

JP    6-34238 U      5/1994
JP    2001-76862 A   3/2001
(Continued)

OTHER PUBLICATIONS

International Search Report mailed Aug. 21, 2012 in PCT/JP2012/004230.

*Primary Examiner* — Rakesh Dhingra
(74) *Attorney, Agent, or Firm* — Rothwell, Figg, Ernst & Manbeck, P.C.

(57) ABSTRACT

The microwave plasma processing apparatus includes a power feeding rod that applies high frequency wave for RF bias, the upper end of which is connected to a susceptor, and the lower end of which is connected to a high frequency output terminal of a matcher in a matching unit; a cylindrical external conductor that encloses around the power feeding rod serving as an internal conductor; and a coaxial line. The coaxial line is installed with a choke mechanism configured to block undesired microwave that enters the line from a plasma producing space in a chamber, and leakage of the microwave to an RF feeding line is prevented in the middle of the line, thereby suppressing the microwave leakage.

9 Claims, 3 Drawing Sheets

(56) References Cited

U.S. PATENT DOCUMENTS

| | | | | |
|---|---|---|---|---|
| 6,057,645 | A * | 5/2000 | Srivastava | H01J 37/32284 156/345.41 |
| 2004/0182320 | A1 * | 9/2004 | Breuls | C03B 37/0183 118/723 MW |
| 2008/0011232 | A1 * | 1/2008 | Rius | C23C 16/045 118/733 |
| 2010/0101728 | A1 * | 4/2010 | Iwasaki | H01J 37/32192 156/345.33 |
| 2010/0243609 | A1 * | 9/2010 | Yamazawa | H01J 37/32091 216/71 |
| 2011/0114261 | A1 * | 5/2011 | Matsumoto | H01J 37/32192 156/345.33 |

FOREIGN PATENT DOCUMENTS

| | | | |
|---|---|---|---|
| JP | WO2010004836 | * | 1/2010 |
| JP | 2010-238730 A | | 10/2010 |
| JP | 2010-258428 A | | 11/2010 |
| TW | 508693 B | | 11/2002 |
| TW | 200806095 A | | 1/2008 |
| TW | 201016080 A | | 4/2010 |
| WO | 2005/045913 A1 | | 5/2005 |

* cited by examiner

PLASMA PROCESSING APPARATUS

CROSS REFERENCE TO RELATED APPLICATION

This application is a 35 U.S.C. 371 National Phase Entry Application from PCT/JP2012/004230, filed Jun. 29, 2012, which claims the benefit of Japanese Patent Application No. 2011-145476, filed Jun. 30, 2011, the disclosures of which are incorporated herein in their entirety by reference.

TECHNICAL FIELD

The present disclosure relates to a plasma processing apparatus which uses microwave in a plasma process, particularly, a plasma processing apparatus which applies high frequency wave for RF bias to an electrode that holds a substrate to be processed in a processing chamber.

BACKGROUND

In a plasma process for manufacturing semiconductor devices or liquid crystal displays, high frequency wave or microwave is used to electrically discharge or ionize a processing gas in a vacuum processing chamber. As for a high frequency discharge method, a capacitive coupling type plasma processing apparatus is mainly used, in which a pair of electrodes is disposed with an adequate gap in parallel such that one electrode is grounded and the other electrode is applied with high frequency wave for producing plasma. However, the high frequency discharge method has some problems in that it is difficult to produce high-density plasma at a low voltage, as well as devices on the surface of the substrate may be easily damaged because of a high electron temperature. In that respect, a microwave discharge method is advantageous in that high-density plasma having a low electron temperature may be produced at a low voltage. In particular, plate-type surface wave plasma (SWP) has an advantage in that large-diameter plasma may be generated efficiently in a wide pressure range, and magnetic field is not needed, thereby facilitating simplification of the plasma processing apparatus.

In the microwave discharge type plasma processing apparatus, particularly, a plasma etching apparatus, an RF electrode is placed at a relatively low position in a processing chamber, a substrate to be processed, for example, a semiconductor wafer is fixed thereon, plasma is generated above the RF electrode by microwave discharge to expose the surface to be processed (upper surface) of the wafer to a reactive radical in the plasma, and high frequency wave for RF bias is applied via a blocking condenser to the RF electrode to draw ions in the plasma onto the surface to be processed of the wafer by a self-biased voltage generated in the RF electrode (see, e.g., Patent Document 1).

PRIOR ART DOCUMENT

Patent Document

Patent Document 1: International Publication WO2005/045913

DISCLOSURE OF THE INVENTION

Problems to be Solved

Conventionally, a coaxial power feeding rod having a high transmission efficiency has been commonly used in an RF feeding line in order to apply high frequency wave for RF bias to an RF electrode. In that case, the power feeding rod is installed on the RF feeding line extending from a matcher to the RF electrode, and a cylindrical external conductor is installed in a transmission section extending from the matcher to the processing chamber to surround the power feeding rod (internal conductor). The external conductor constitutes a return wire or a grounding line. The space between the power feeding rod and the external conductor may be filled with a dielectric material, but generally filled with air. Meanwhile, the RF electrode is attached through an insulating support member to the processing chamber in an electrically floating state.

In such an apparatus structure, microwave introduced into the processing chamber for microwave discharge may leave a substrate support member (insulator) at a plasma producing space above the RF electrode and enter a coaxial line of the RF feeding line in some cases. The microwave entering the coaxial line is propagated in the space between the power feeding rod and the external conductor in a direction opposite to the RF high frequency wave flowing on the surface of the power feeding rod, and is drawn into the matcher. When the microwave is drawn into the matcher, it may become noise for an RF control unit, for example, to cause an automatching malfunction, or the microwave may leak out from the opening (for example, a cooling fan) of the matcher to cause radio noise.

The present invention has been made to solve the problems in the related art as described above, and provides a plasma processing apparatus configured to efficiently suppress the microwave used in microwave discharge from leaking to the RF feeding line in the middle of the line so as to prevent a leakage disturbance of microwave reliably.

Means to Solve the Problems

The plasma processing apparatus of the present invention includes a processing chamber that can be evacuated to a vacuum state; a processing gas supplying unit configured to supply a processing gas to the processing chamber; a microwave supplying unit configured to supply microwave to the processing chamber in order to produce plasma of the processing gas; an electrode configured to hold a substrate to be processed so as to be exposed to the plasma in the processing chamber; a high frequency power supplying unit configured to apply high frequency wave for RF bias via a power feeding rod having a cylindrical shape; an external conductor that encloses a periphery of the power feeding rod; and a choke mechanism configured to block a spatial propagation of the microwave between the power feeding rod and the external conductor.

In the configuration of the apparatus, a predetermined processing gas is introduced from the processing gas supplying unit into the vacuum processing chamber, the microwave is introduced from the microwave supplying unit, the particles of the processing gas are electrically discharged (ionized) by the microwave power such that plasma is produced, and micromachining such as etching, film formation, sputtering or oxidation is performed on the substrate placed on the electrode under the plasma. In the plasma processing, especially immediately before plasma ignition, a part of the plasma which has not been consumed (absorbed) in the processing chamber may enter the line of the power feeding rod having a coaxial structure, that is, the coaxial line for high frequency feeding. However, since the choke mechanism blocks the microwave in the middle of the coaxial line so that the microwave is not propagated earlier than the plasma, a leakage disturbance of microwave may be suppressed.

The choke mechanism according to the present invention includes, as a preferred basic configuration, a first waveguide having a line length of ¼ wavelength that extends in parallel with an axis direction of the power feeding rod with a gap narrower than a distance between the outer peripheral surface of the power feeding rod and the inner peripheral surface of the external conductor to form a cylindrical shape; and a second waveguide having a line length of ¼ wavelength that is connected to a terminal end of the first waveguide when viewed from the electrode side, and short-circuited. In this configuration, the start end or entrance of the first waveguide is made in a short-circuited state, that is, in substantially the same state as being blocked by a conductor wall, by using the nature of ¼ wavelength line, thereby effectively suppressing the propagation of the microwave.

In a preferred aspect, the choke mechanism of the present invention includes a first cylindrical conductor that extends in parallel with the axis direction of the power feeding rod to form the first waveguide in a cylindrical shape between the outer peripheral surface thereof and the inner surface of the external conductor, and to form the second waveguide in a cylindrical shape between the inner peripheral surface thereof and the outer peripheral surface of the power feeding rod; a first annular conductor that extends in a radial direction orthogonal to the axis direction from the power feeding rod to connect to a front end of the first cylindrical conductor, and short-circuits a terminal end of the second waveguide; and a second annular conductor that extends in a radial direction orthogonal to the axis direction from the power feeding rod to form a first gap and a second gap with rear end of the cylindrical conductor and the inner peripheral surface of the external conductor, respectively, and connects a terminal end of the first waveguide and a start end of the second waveguide in the first gap.

According to a preferred aspect of the present invention, a matcher is electrically inserted into a gap between the high frequency power supply and the electrode. Here, one end of the power feeding rod is connected to a first output terminal of the matcher, and the other end is connected to the electrode. In addition, one end of the external conductor is connected to a second output terminal of the matcher, and the other end is connected to the processing chamber. In this case, the microwave introduced into the axial line for high frequency feeding is blocked by the choke mechanism, and thus, is not propagated to the matcher. In addition, a malfunction of the matcher or a leakage of the microwave from the matcher to the outside is not caused.

According to a preferred aspect of the present invention, the external conductor is connected at a ground potential along with the processing chamber. Preferably, the microwave supplying unit has an antenna installed around or near the processing chamber, and a window made of a dielectric material to introduce the microwave into the processing chamber. Further, a magnetic field formation mechanism configured to form a predetermined magnetic field in the processing chamber may be installed around or near the processing chamber.

Effect of the Invention

According to the plasma processing apparatus of the present invention, even though the microwave used in the microwave discharge is introduced into the RF feeding line, the choke mechanism blocks the microwave effectively in the middle of the line, by the configuration and operation as described above. Thus, a leakage disturbance of microwave may be prevented reliably.

DETAILED DESCRIPTION TO EXECUTE THE INVENTION

Hereinafter, preferred embodiments of the present invention will be described in detail with reference to the accompanying drawings.

Figure 1:
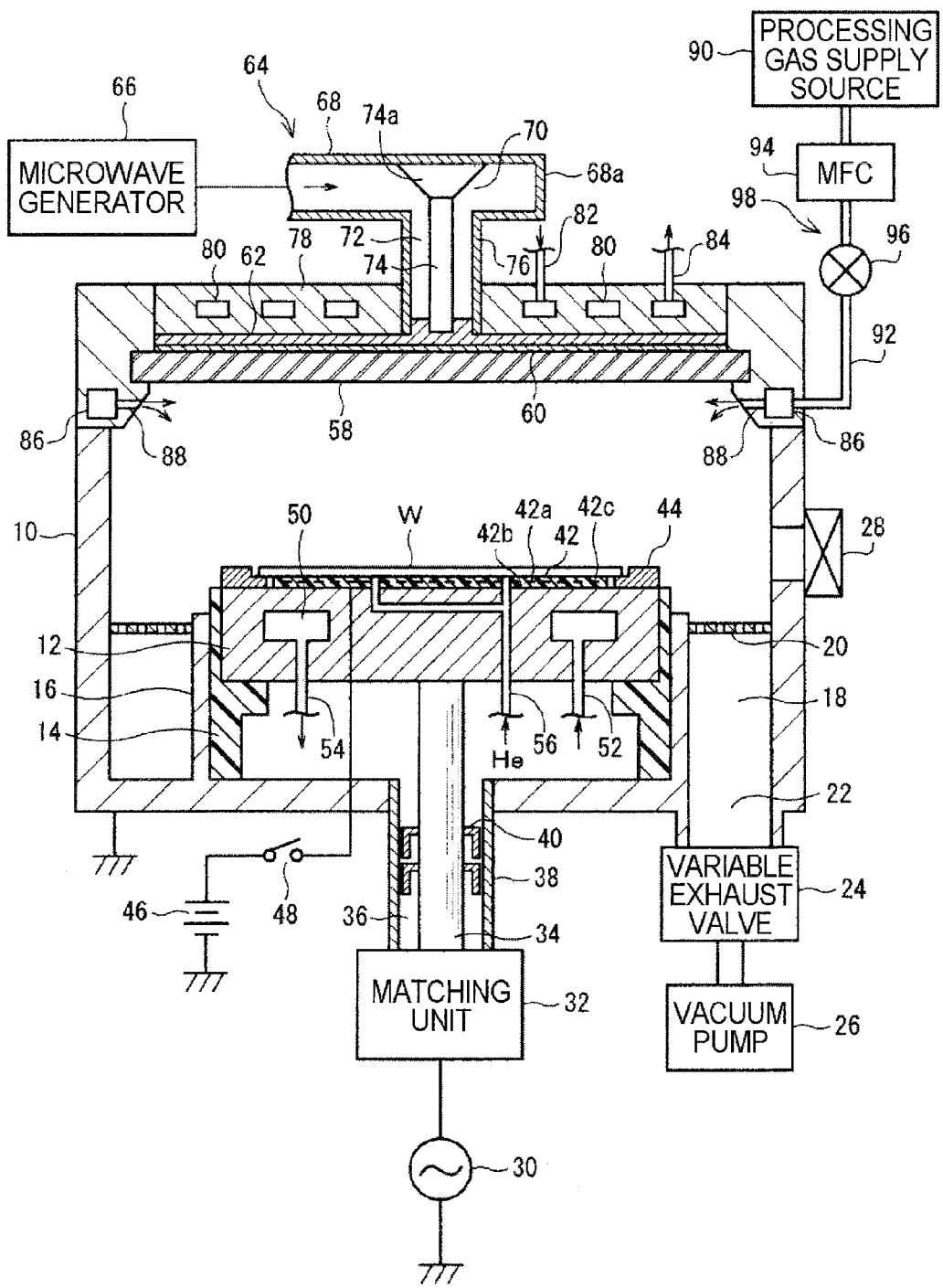
FIG. 1 is a view illustrating a configuration of a microwave plasma processing apparatus according to an exemplary embodiment of the present invention.

FIG. 1 illustrates a configuration of a microwave plasma etching apparatus according to an exemplary embodiment of the present invention. The microwave plasma etching apparatus is constructed as a planar SWP type plasma processing apparatus, which does not require a magnetic field, and includes a cylindrical vacuum chamber (processing chamber) 10 made of a metal such as, for example, aluminum or stainless steel. The chamber 10 is grounded for safety reasons.

First, descriptions will be made on respective elements which are not involved in producing plasma in the microwave plasma etching apparatus.

At the center of the lower portion in the chamber 10, a disc-shaped susceptor 12, on which a substrate to be processed, for example, a semiconductor wafer W is disposed, is disposed horizontally as a substrate holding table which serves as a high frequency electrode. The susceptor 12 is made of, for example, aluminum, and supported on an insulating cylindrical support 14 that extends vertically upwards from the bottom of the chamber 10.

An annular exhaust path 18 is formed between a conductive cylindrical support 16 that extends vertically upwards from the bottom of the chamber 10 along the outer periphery of the cylindrical support 14, and the inner wall of the chamber 10. An annular baffle plate 20 is attached to the upper portion or entrance of the exhaust path 18, and a single or a plurality of exhaust ports 22 are installed on the bottom. A vacuum pump 26 is connected via a variable exhaust valve 24 having an APC function to the exhaust port 22. The vacuum pump 26 may include, for example, a turbo-molecular pump and evacuate the plasma processing space in the chamber 10 to a desired degree of vacuum. A gate valve 28 configured to open/close a carrying-in/out port of the semiconductor wafer W is attached to the outer surface of the sidewall of the chamber 10.

A high frequency power supply 30 for RF bias is electrically connected to the susceptor 12 via a matching unit 32 and a power feeding rod 34. The high frequency power supply 30 outputs high frequency wave with relatively low frequency suitable for controlling energy drawn into the semiconductor wafer W, for example, 13.56 MHz. The matching unit 32 accommodates a matcher configured to perform matching between a high frequency power 30 side impedance and a load (mainly the electrode, plasma or chamber) side impedance, and the matcher includes a blocking condenser for self-bias generation. Further, the matching unit 32 is provided with an RF sensor configured to measure the load impedance or a controller configured to variably adjust values (impedance positions) of variable reactance devices in the matcher, a step motor, and a cooling fan, in addition to the matcher (a matching circuit).

The power feeding rod 34 is made up of a columnar or cylindrical conductor having a predetermined outer diameter in which the upper end of the power feeding rod 34 is connected to the central portion of the lower surface of the susceptor 12 and the lower end of the power feeding rod 34 is connected to a high frequency output terminal of the matcher in the matching unit 32. Further, a cylindrical external conductor 38 that surrounds the power feeding rod 34 serving as an internal conductor is installed between the bottom of the chamber 10 and the matching unit 32 in order to form a coaxial line 36. More specifically, the bottom (lower surface) of the chamber 10 is formed with a circular opening having a predetermined diameter greater than the outer diameter of the power feeding rod 36, and the upper end of the external conductor 38 is connected to the circular opening and the lower end of the external conductor 38 is connected to the grounding (return wire) terminal of the matcher.

The coaxial line 36 is provided with a choke mechanism 40 configured to block spatial propagation of the undesired microwave introduced into the line. The configuration and function of the choke mechanism 40 will be described below in detail.

An electrostatic chuck 42 configured to hold the semiconductor wafer W with electrostatic force is installed on the top of the susceptor 12, and a focus ring 44 that surrounds the periphery of the semiconductor wafer W in an annular form is installed at a radially outside of the electrostatic chuck 42. The electrostatic chuck 42 is formed by inserting an electrode 42a made of a conductive film between two layers of insulating films 42b, 42c, and a DC power supply 46 is electrically connected to the electrode 42a via a switch 48. The semiconductor wafer W may be attracted to and held on the electrostatic chuck 42 with Coulomb force by DC voltage applied from the DC power supply 46.

An annular coolant chamber 50 that extends, for example, circumferentially is installed inside the susceptor 12. A refrigerant at a predetermined temperature, for example, cooling water is circulated and supplied from a chiller unit (not illustrated) through pipes 52, 54 to the refrigerant chamber 50. The processing temperature of the semiconductor wafer W on the electrostatic chuck 42 may be controlled by the temperature of the coolant. Further, a heat transfer gas from a heat transfer gas supplying unit (not illustrated), for example, helium (He) gas is supplied through a gas supplying pipe 56 to a gap between the upper surface of the electrostatic chuck 42 and the rear surface of the semiconductor wafer W. Further, lift pins that are movable up and down vertically through the susceptor 12 to load/unload the semiconductor wafer W, and an elevation mechanism thereof (not illustrated) may also be provided.

Next, descriptions will be made on respective elements which are involved in producing plasma in the microwave plasma etching apparatus.

A circular quartz plate 58 as a dielectric plate for introducing microwave is hermetically attached to the ceiling opposite to the susceptor 12 of the chamber 10. The quartz plate 58 is provided with a disc-shaped radial line slot antenna 60 having a plurality of slots that are distributed concentrically, as a flat slot antenna, on the top surface thereof. The radial line slot antenna 60 is electromagnetically connected to a microwave transmission line 64 via a delay plate 62 made of a dielectric material such as, for example, quartz.

The microwave transmission line 64 transmits microwave of, for example, 2.45 GHz, which is output from a microwave generator 66, to the antenna 60, and includes a waveguide tube 68, a waveguide tube-coaxial tube converter 70, and a coaxial tube 72. The waveguide tube 68 is, for example, a rectangular waveguide tube, and transmits the microwave from the microwave generator 66 towards the chamber 10 up to the waveguide tube-coaxial tube converter 70 using a $TE_{10}$ mode as a basic mode.

In order to couple the rectangular waveguide tube 68 and the coaxial tube 72, an internal conductor 74 of the coaxial tube 72 protrudes from the waveguide tube-coaxial tube converter 70 to the rectangular waveguide tube 68, at a position of ¼ wavelength from a short circuit plate 68a, which is a center of the width of an H-plane (a plane parallel to the magnetic field) of the rectangular waveguide 68. Whereas, the characteristic impedance of the coaxial tube 72 is usually designed to 50Ω, the characteristic impedance of the rectangular waveguide tube 68 is much greater than the designed impedance (usually, several hundred Ω or more). Accordingly, it is preferred to adopt a configuration that an upper end portion 74a of the internal conductor 74 in the coaxial tube 72, which constitutes a connector unit, is made thick in a reverse-tapered shape (so-called a door knob type configuration) as illustrated.

The coaxial 72 tube extends vertically downwards from the waveguide tube-coaxial tube converter 70 to the central portion of the upper surface of the chamber 10, and the terminal end or lower end of thereof is coupled to the antenna 60 through the delay plate 62. The external conductor 76 of the coaxial tube 72 is formed in a cylindrical shape integrally with the rectangular waveguide tube 68, and the microwave is propagated in the TEM mode to the space between the internal conductor 74 and the external conductor 76.

The microwave output from the microwave generator 66 is propagated in the microwave transmission line 64 including the waveguide tube 68, the waveguide tube-coaxial tube converter 70 and the coaxial tube 72 as described above, and fed to the antenna 60 through the delay plate 62. And, the microwave spread in the radial direction from the antenna 60 is radiated from each slot of the antenna towards the inside of the chamber 10, and the microwave power radiated from the surface wave propagated along the interface between the quartz plate 58 and plasma to produce plasma ionizes the gas in the vicinity of the interface.

An antenna rear surface plate 78 is installed on the delay plate 62 so as to cover the upper surface of the chamber 10. The antenna rear surface plate 78 is made of, for example, aluminum, serves as a cooling jacket configured to absorb (radiate) heat generated from the quartz plate 58, and has flow paths 80 formed therein, in which a coolant at a predetermined temperature, for example, cooling water is circulated and supplied from a chiller unit (not illustrated) through pipes 82, 84.

In the present exemplary embodiment, in order to introduce the processing gas into the chamber 10, there are provided a buffer chamber 86 formed in an annular shape in the sidewall of the chamber 10 at a position slightly lower than the quartz plate 58, a plurality of lateral gas discharge holes 88 facing the plasma producing space at equal intervals in the circumferential direction from the buffer chamber 86, and a gas supplying pipe 92 extending from a processing gas supply source 90 to the buffer chamber 86. Further, a mass flow controller (MFC) 94 and an opening/closing valve 96 are installed in the middle of the gas supplying pipe 92.

In a processing gas introduction mechanism 98 having such a configuration, the processing gas sent out from the processing gas supply source 90 passes through the gas supplying pipe 92, and is introduced into the buffer chamber 86 in the sidewall of the chamber 10. After the pressure in the circumferential direction is equalized in the buffer chamber 86, the processing gas is discharged substantially horizontally from each lateral gas discharge port 88 towards the center of the chamber 10, and is diffused into the plasma processing space.

In order to perform etching with the microwave plasma etching apparatus, first, the semiconductor wafer W, which is an object to be processed, is carried in to the chamber 10 by a gate valve 28 in an open state, and is disposed on the electrostatic chuck 42. Then, an etching gas (generally, a mixed gas) is introduced from the processing gas introduction mechanism 98 into the chamber 10 in a predetermined flow rate and flow ratio, and the pressure in the chamber 10 is reduced to a set value by the exhaust mechanisms 24, 26. Further, the high frequency power supply 30 is turned ON to output high frequency wave with a predetermined power, and the high frequency wave is applied to the susceptor 12 through the matching unit 32 and the power feeding rod 34. Further, the switch 48 is turned ON to apply the DC voltage from the DC power supply 46 to the electrode 42a of the electrostatic chuck 42, and thus, the semiconductor wafer W is fixed on the electrostatic chuck 42 by electrostatic force. And, the microwave generator 66 is turned ON to feed the microwave output from the microwave generator 66 to the antenna 60 via the microwave transmission line 64, and introduce the microwave radiated from the antenna 60 into the chamber 10 via the quartz plate 58.

The etching gas introduced from the lateral gas discharge port 88 of the processing gas introduction mechanism 98 into the chamber 10 is diffused under the quartz plate 58, and the gas particles are ionized by the microwave power radiated from the surface wave propagated along the lower surface (a surface facing the plasma) of the quartz plate 58 to produce surface wave excitation plasma. In this way, the plasma produced under the quartz plate 58 is diffused downwards, and thus, isotropic etching by radicals in the plasma and vertical etching by ion irradiation are performed on a film to be processed of the main surface of the semiconductor wafer W.

In the microwave plasma etching apparatus, a part of the microwave may leave the cylindrical support member 14 at the plasma producing space in the chamber 10 and enter the coaxial line 36 of the RF feeding line from the opening on the bottom of the chamber 10. Particularly, there is some time lag until the microwave discharge is started after the microwave generator 66 is turned ON, and during the time lag (immediately before plasma ignition), the microwave introduced into the chamber 10 is propagated in the plasma producing space and enters the coaxial line 36 without being consumed by discharge. And, the microwave is propagated in the TEM mode in the coaxial line 36 in a direction opposite to the high frequency wave for RF bias. However, even though the microwave enters the coaxial line 36, the microwave is blocked by the choke mechanism 40 installed in the middle of the coaxial line 36, and thus, does not reach the matching unit 32. Accordingly, the microwave plasma etching apparatus is configured such that the RF control unit such as an RF sensor or a controller in the matching unit 32 may not malfunction by noise of the microwave, and that the microwave which leaks out from the opening of the matching unit 32 such as a fan may not cause a radio noise in a wireless LAN, for example.

Hereinafter, descriptions will be made on the configuration and function of the choke mechanism 40, which is a major characteristic part in this exemplary embodiment.

Figure 2:
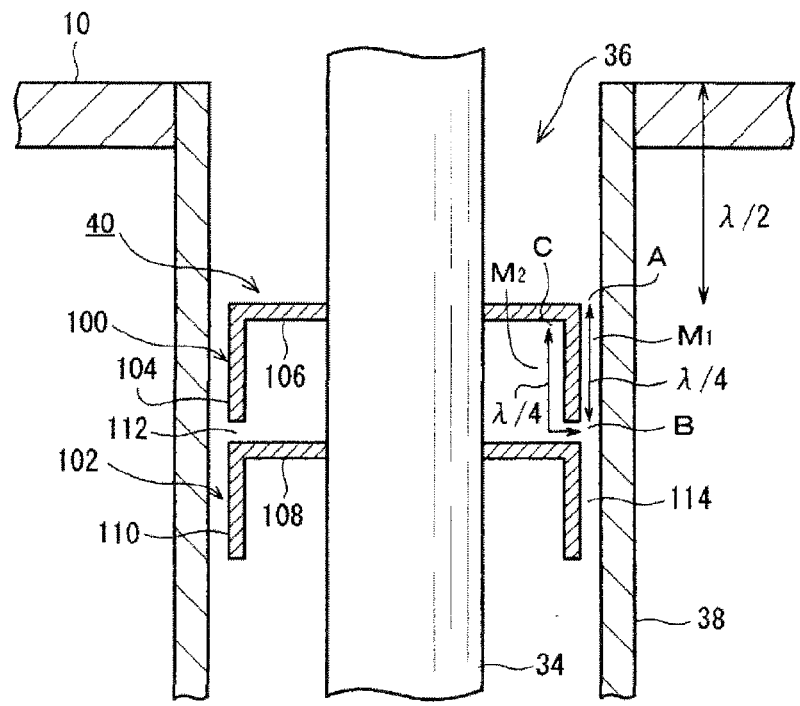
FIG. 2 is a vertical cross-section view illustrating a configuration of an example of a choke mechanism installed in the microwave plasma processing apparatus as illustrated in FIG. 1.

FIG. 2 illustrates a configuration of an example of the choke mechanism 40. The choke mechanism 40 is formed by attaching two conductor members 100, 102, which are made of, for example, aluminum, to the power feeding rod 34, for example, by welding.

The first conductor member 100 is provided with a cylindrical portion 104 that extends in parallel with the axial direction of the power feeding rod 34, and an annular portion 106 that extends from the power feeding rod 34 in the radial direction orthogonal to the axial direction to connect to the front end (upper end) of the cylindrical portion 104. Here, a first ¼ wavelength waveguide M1 having a line length of ¼ (λ/4) wavelength is formed in a cylindrical shape between the outer peripheral surface of the cylindrical portion 104 and the inner peripheral surface of the external conductor 38, and a second ¼ wavelength waveguide M2 is formed in a cylindrical shape between the inner peripheral surface of the cylindrical portion 104 and the outer peripheral surface of the power feeding rod 34.

The second conductor member 102 is provided with an annular portion 108 that extends from the power feeding rod 34 in the radial direction orthogonal to the axial direction, and a cylindrical portion 110 that extends from the outer peripheral edge of the annular portion 108 towards the matching unit 32 (FIG. 1) side. Here, an annular gap 112 is formed between the outer peripheral edge of the annular portion 108 and the rear end (lower end) of the cylindrical portion 104 of the first conductor member 100, and a cylindrical gap 114 is formed between the outer peripheral edge of the annular portion 108 and the outer peripheral surface of the cylindrical portion 110, and the inner peripheral surface of the external conductor 38.

As an adhesion position of the choke mechanism 40 on the axial line 36, it is preferred that the start end (Point A) of the first waveguide M1 is set to be at a position spaced ½ wavelength (λ/2) from the entrance of the coaxial line 36 (upper end of the external conductor 38) towards the high frequency power supply 30, for the reason as described below.

In the choke mechanism 40 having such a configuration, with respect to the microwave propagated in the TEM mode from the chamber 10 side into the coaxial line 36, the terminal end of the first ¼ wavelength waveguide M1 and the start end of the second ¼ wavelength waveguide M2 are connected at the annular gap 112 (Point B), and the second ¼ wavelength waveguide M2 is short-circuited and terminated at the lower surface of the annular portion 106 (Point C). Accordingly, by the property of the ¼ wavelength line, the waveguide connecting point (Point B) becomes an open state of an infinite impedance, and the start end (Point A) of the first ¼ wavelength waveguide M1 becomes a short-circuited state of a zero impedance. That is, the start end or entrance of the first ¼ wavelength waveguide M1 becomes a state as if it is blocked by a conductor wall with respect to the microwave, and thus, the propagation of the microwave is substantially prevented here. In this way, the microwave does not leave the gap 114 between the second conductor member 102 and the external conductor 38 towards the matching unit 32. Further, because the start end of the first ¼ wavelength waveguide M1 is in the short-circuited state, nodes of a standing wave are generated at the entrance of the coaxial line 36 spaced ½ wavelength ($\lambda/2$) therefrom, resulting in a stable standing wave.

Meanwhile, since the high frequency wave for RF bias from the high frequency power supply 30 is fed to the RF electrode 12 through the surface of the power feeding rod 34, its transmission is not affected by the choke mechanism 40. Therefore, the choke mechanism 40 functions as a kind of a low-pass filter that allows high frequency wave for RF bias (for example, 2 MHz) to pass through and blocks microwave (2.45 GHz).

Figure 3:
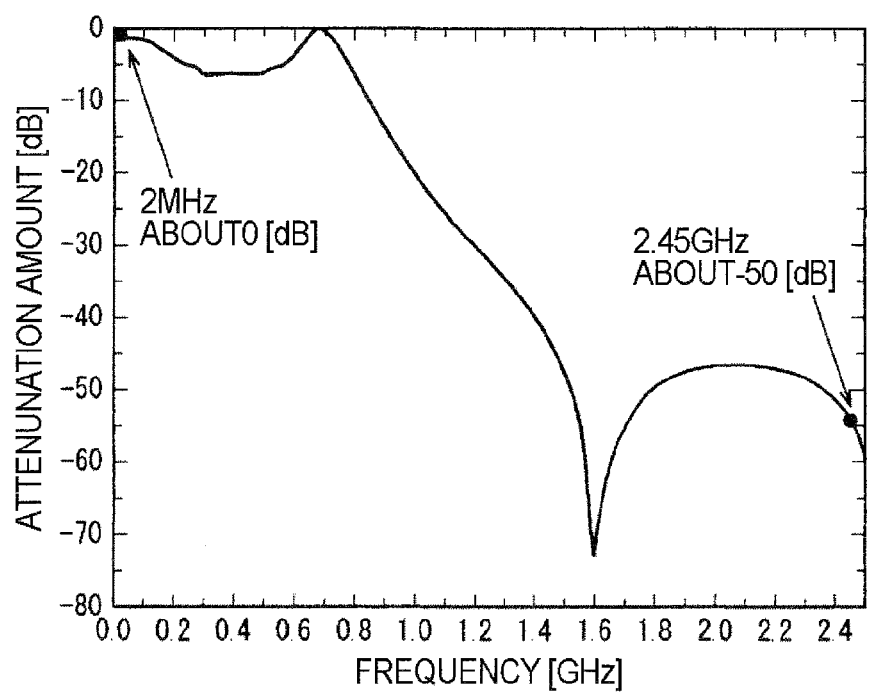
FIG. 3 is a graph representing a filtering property of the choke mechanism installed in the microwave plasma processing apparatus as illustrated in FIG. 1.

FIG. 3 illustrates a filtering property of the choke mechanism 40 by simulation. As illustrated, the attenuation amount of 2 MHz is about 0 dB, and the high frequency wave for RF bias passes through the choke mechanism 40 almost without being attenuated. In contrast, the attenuation amount of 2.45 GHz is about −50 dB, and the microwave is attenuated to a hundred thousandth, and thus, substantially completely blocked.

In this exemplary embodiment, the configuration of the choke mechanism 40 as illustrated in FIG. 2 is an example, and various modifications may be made within the technical spirit of the present invention. Several modified embodiments of the choke mechanism 40 will be illustrated in FIGS. 4 and 5.

Figure 4:
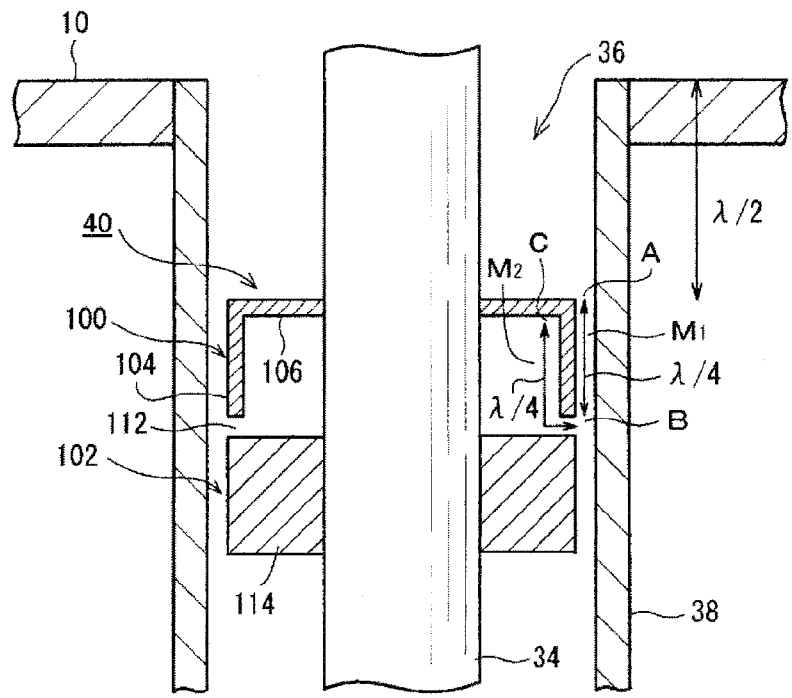
FIG. 4 is a view illustrating a configuration of a choke mechanism according to another exemplary embodiment.
Figure 5:
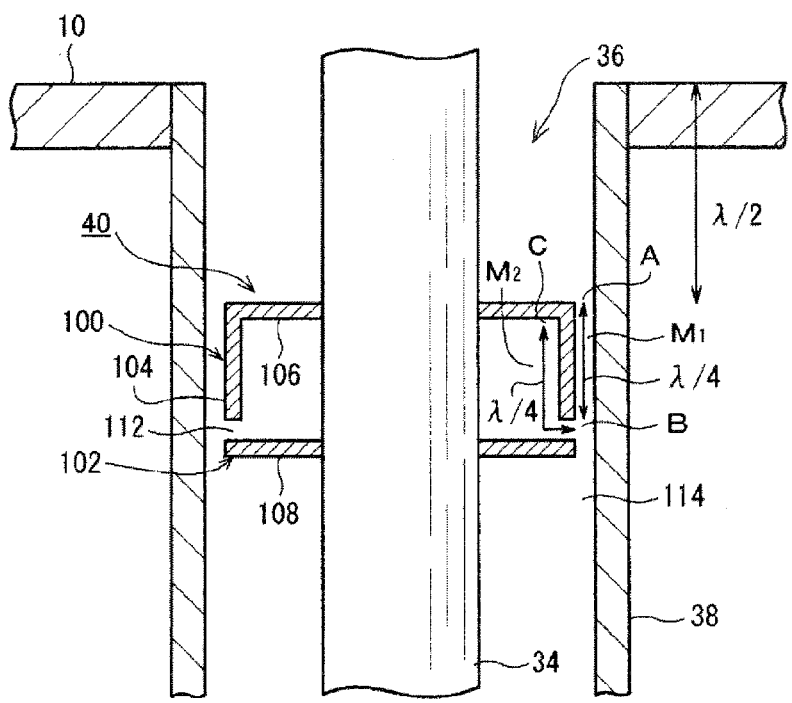
FIG. 5 is a view illustrating a configuration of a choke mechanism according to a further exemplary embodiment.

In the configuration as illustrated in FIG. 4, the second conductor member 102 is replaced with a thick annular member 114 serving as both of the annular portion 108 and the cylindrical portion 110 as illustrated in FIG. 2. Basically, the second conductor member 102 is configured to connect the first and second ⅓ wavelength waveguides M1, M2, which are respectively formed at the outer peripheral side and the inner peripheral side of the cylindrical portion 104 of the first conductor member 100, that is, may form the annular gap 112. Accordingly, as illustrated in FIG. 5, the second conductor member 102 may also be formed with a thin annular portion 108.

In addition to the configuration of the choke mechanism 40 as described above, various modifications may be made elsewhere within the spirit of the present invention. Especially, the electrode that applies high frequency wave for RF bias may have any configuration, and in the broadest technical spirit of the present invention, the choke mechanism of the present invention may be employed for any plasma processing apparatuses using a power feeding rod having a coaxial structure to feed high frequency wave to a high frequency electrode in a chamber for any purpose. Further, although not illustrated in the drawings, when a coaxial cable in an RF feeding line is used, a choke mechanism having the same configuration and function as those of the choke mechanism 40 in the above exemplary embodiment may be installed between an external conductor and an inner conductor of the coaxial cable.

The present invention may be applied to any plasma processing apparatuses using microwave to produce plasma, and the microwave introduction and discharge mechanism, processing gas introduction mechanism and exhaust mechanism are not limited to the above exemplary embodiments. For example, the microwave introduction and discharge mechanism may be an apparatus that uses an antenna other than the radial line slot antenna 60 or an apparatus that introduces microwave not through an antenna but through a dielectric window from a microwave transmission line. Further, the present invention may be applied to an apparatus an electron cyclotron resonance (ECR) apparatus using ECR in which a magnetic field formation mechanism such as a permanent magnet or an electronic coil is installed around the chamber 10.

Further, the present invention is not limited to the plasma etching apparatus, but may be applied to apparatuses for processing such as plasma oxidation, plasma nitration and sputtering. Further, the substrate to be processed of the present invention is not limited to the semiconductor wafer, but may be various substrates for flat panel display, photomasks, CD substrates and print substrates.

DESCRIPTION OF SYMBOL

10: chamber
12: susceptor (substrate holding table)
26: vacuum pump
30: high frequency power supply
32: matching unit
34: power feeding rod
36: coaxial line
38: external conductor
40: choke mechanism
58: quartz plate (dielectric window)
60: antenna
64: microwave transmission line
66: microwave generator
98: processing gas introduction mechanism
100: first conductor member
102: second conductor member
104: cylindrical portion
106: annular portion
108: annular portion
110: cylindrical portion
112: annular gap
M1: first ¼ wavelength waveguide
M2: second ¼ wavelength waveguide

What is claimed is:

1. A plasma processing apparatus, comprising:
a processing chamber that can be evacuated to a vacuum state;
a processing gas supplying unit configured to supply a processing gas to the processing chamber;
a microwave supplying unit configured to supply microwave to the processing chamber in order to produce plasma of the processing gas;
an electrode configured to hold a substrate to be processed so as to be exposed to the plasma in the processing chamber;
a high frequency power supplying unit configured to apply high frequency wave for RF bias via a power feeding rod having a cylindrical shape;
an external conductor that encloses a periphery of the power feeding rod; and
a choke mechanism installed on an outer peripheral surface of the power feeding rod and disposed in a coaxial line formed between the outer peripheral surface of the power feeding rod and an inner peripheral surface of the external conductor, and the choke mechanism configured as a low-pass filter that allows the high frequency wave for RF bias to pass through a surface of the power feeding rod and blocks a coaxial space propagation of the microwave introduced from the microwave supplying unit propagating through a processing space provided above a susceptor serving as an RF electrode into a space of the coaxial line via an opening provided at a bottom portion of the processing chamber for the choke mechanism, the microwave supplying unit being disposed above the susceptor.

2. The plasma processing apparatus of claim 1, wherein the choke mechanism comprises:
   a first conductor member provided on the power feeding rod; and
   a second conductor member provided below the first conductor in an axis direction of the power feeding rod,
   wherein the first conductor member includes:
   a first cylindrical portion configured to extend in parallel with the axis direction of the power feeding rod; and
   a first annular portion configured to extend from the power feeding rod in a radial direction orthogonal to the axis direction to connect to an upper end of the first cylindrical portion,
   the second conductor member includes:
   a second annular portion configured to extend from the power feeding rod in the radial direction orthogonal to the axis direction to form a first gap between an outer peripheral edge of the second annular portion and a lower end of the first cylindrical portion; and
   a second cylindrical portion configured to extend from an outer peripheral edge of the second annular portion toward a lower direction of the power feeding rod to form a second gap between an outer peripheral surface of the second cylindrical portion and an inner peripheral surface of the external conductor,
   wherein the first conductor member further includes:
   a first waveguide having a line length of ¼ wavelength and configured to extend in parallel with the axis direction of the power feeding rod in a cylindrical shape with a third gap formed between an outer peripheral surface of the first cylindrical portion and the inner peripheral surface of the external conductor, each of the second gap and the third gap being narrower than a distance between the outer peripheral surface of the power feeding rod and the inner peripheral surface of the external conductor to form a cylindrical shape; and
   a second waveguide having a line length of ¼ wavelength and configured to be connected to a terminal end of the first waveguide when viewed from the electrode side, and short-circuited.

3. The plasma processing apparatus of claim 2, wherein the first waveguide is further configured to be formed in a cylindrical shape in the second gap, the second waveguide is further configured to be formed in a cylindrical shape between the inner peripheral surface of the first cylindrical portion and the outer peripheral surface of the power feeding rod,
   the first annular portion is further configured to short-circuit a terminal end of the second waveguide at a lower surface thereof, and
   the second annular portion is further configured to connect the terminal end of the first waveguide and a start end of the second waveguide in the first gap.

4. The plasma processing apparatus of claim 2, wherein the choke mechanism is provided in the coaxial line such that an upper end of the first waveguide is spaced ½ wavelength ($\lambda/2$) from an upper end of the external conductor towards the high frequency power supplying unit.

5. The plasma processing apparatus of claim 1, wherein a matching unit is electrically connected between the high frequency power supply and the electrode,
   one end of the power feeding rod is connected to a first output terminal of the matching unit, and the other end is connected to the electrode, and
   one end of the external conductor is connected to a second output terminal of the matching unit, and the other end is connected to the processing chamber.

6. The plasma processing apparatus of claim 1, wherein the external conductor is connected at a ground potential.

7. The plasma processing apparatus of claim 1, wherein the microwave supplying unit has an antenna installed around or near the processing chamber.

8. The plasma processing apparatus of claim 1, wherein the microwave supplying unit has a window made of a dielectric material to introduce the microwave into the processing chamber.

9. The plasma processing apparatus of claim 1, further comprising a magnetic field formation mechanism configured to form a predetermined magnetic field in the processing chamber and installed around or near the processing chamber.

* * * * *